United States Patent [19]

Watanabe et al.

[11] Patent Number: 5,091,337
[45] Date of Patent: Feb. 25, 1992

[54] METHOD OF MANUFACTURING AMORPHOUS-SILICON THIN-FILM TRANSISTORS

[75] Inventors: Yoshiaki Watanabe; Sakae Tanaka, both of Tokyo, Japan

[73] Assignee: Seikosha Co., Ltd., Tokyo, Japan

[21] Appl. No.: 609,127

[22] Filed: Nov. 1, 1990

Related U.S. Application Data

[63] Continuation of Ser. No. 496,049, Mar. 16, 1990, abandoned, which is a continuation of Ser. No. 283,405, Dec. 12, 1988, abandoned.

Foreign Application Priority Data

Dec. 26, 1987 [JP] Japan .................. 62-331068

[51] Int. Cl.⁵ .................. H01L 21/44; H01L 21/265
[52] U.S. Cl. .................. 437/181; 437/41; 437/48; 437/909; 148/DIG. 105
[58] Field of Search .......... 437/47, 48, 56, 57, 437/101, 40, 41, 43, 181, 909; 148/DIG. 1, DIG. 105; 357/23.7, 30

[56] References Cited

U.S. PATENT DOCUMENTS

| | | | |
|---|---|---|---|
| 4,587,720 | 5/1986 | Chenevas-Paule et al. | 437/56 |
| 4,715,930 | 12/1987 | Diem | 357/2 |

FOREIGN PATENT DOCUMENTS

| | | | |
|---|---|---|---|
| 0090661 | 10/1983 | European Pat. Off. | |
| 0030376 | 2/1987 | Japan | 437/40 |
| 0115868 | 5/1987 | Japan | 437/41 |

Primary Examiner—Brian E. Hearn
Assistant Examiner—Tuan Nguyen
Attorney, Agent, or Firm—Jordan and Hamburg

[57] ABSTRACT

A method for manufacturing an amorphous silicon thin film transistor in which a gate insulating layer is provided over a gate on a substrate. An amorphous silicon layer is formed on the gate insulating layer, and a protective insulating layer is formed on the amorphous silicon layer. A pattern conforming to the gate is applied to the protective layer, and the amorphous layer is exposed in regions outside of the pattern. A doped silicon layer is then added, and source and drain electrodes formed to partly overlap the remaining protective insulating layer.

3 Claims, 4 Drawing Sheets

METHOD OF MANUFACTURING AMORPHOUS-SILICON THIN-FILM TRANSISTORS

This application is a continuation of application Ser. No. 07/496,049, filed Mar. 16, 1990, now abandoned, which is a continuation of Ser. No. 07/283,405 filed Dec. 12, 1988, now abandoned.

DETAILED DESCRIPTION OF THE INVENTION

1. Field of the Invention

This invention relates to a method of manufacturing amorphous-silicon thin-film transistors.

2. Prior Art

A liquid crystal matrix display in which a MIS-type thin-film transistor using amorphous-silicon is provided for each pixel as the switching element, i.e., the so-called active matrix type liquid crystal display, is conventionally used as a thin image display.

FIG. 3 shows an example of the construction of the above-described active matrix type liquid crystal display. When, for example, Y1 is selected from among scanning lines 9, the gates of the thin-film transistors 11 connected thereto are simultaneously turned on, and through the sources of these thin-film transistors which have been thus turned on, a signal voltage corresponding to image information is transmitted from each of signal lines 10 to the drain of each transistor. Connected to each drain is a pixel electrode (not shown), images being displayed by varying the light transmittance of a liquid crystal layer 12 through the voltage difference between this pixel electrode and an opposed electrode 13 formed on a substrate on the opposite side with respect to the liquid crystal layer 12. After the above-mentioned gates are turned off, the voltage difference between the above-mentioned pixel electrode and the opposed electrode 13 is retained until the scanning line Y1 is selected for the next time, so that the liquid crystal corresponding to each pixel is staticdriven, thus realizing a high-contrast image display.

Japanese Patent Laid-Open No. 58-212177 discloses a method of manufacturing thin-film transistors 11 in which a gate insulating layer, an amorphous-silicon layer and a protective insulating layer are successively formed from the standpoint of securing reliability and reproducibility of the manufacturing process, etc.

FIG. 4 illustrates the above-mentioned conventional manufacturing process. First, a gate electrode 15 is formed on an insulating substrate 14 of glass or the like. Then, a gate insulating layer 16, an amorphous-silicon layer 17, and a protective insulating layer 18 are successively formed (FIG. 4(a)). Subsequently, ultraviolet rays are applied from above, with photoresist in a predetermined configuration being used as the mask, thereby making openings in the protective insulating layer 18 so as to expose the amorphous-silicon layer 17 in such a manner that the protective insulating layer 18 partly overlaps the gate 15 (FIG. 4(b)). A silicon layer 19 which contains impurities serving as the donor or the acceptor is then formed. The silicon layer 19, the protective insulating layer 18, and the amorphous-silicon layer 17 are selectively removed, thereby forming an island structure including said openings (FIG. 4(c)). Subsequently, a transparent conductive layer 20 is formed, and is selectively removed, thereby forming a source electrode drain pattern, a source wiring pattern, and a pixel electrode pattern. The silicon layer 19 is then removed using the patterns of this transparent conductive layer 20 as the mask (FIG. 4(d)).

3. Problems to be Solved by the Invention

Suppose in the above conventional method the minimum unit based on the design rule such as the minimum circuit wiring distance is L, an overlapping area with a width 2L is formed both in the section between the gate and the drain and that between the gate and the source. As a result, overlapping capacitance is generated in these areas, which involves the following problems:

FIG. 5 shows the construction of one pigment portion of an active matrix type liquid crystal display using the thin-film transistor shown in FIG. 4, focusing in particular on the overlap capacitance in the thin-film transistor. The reference numeral 21 denotes a thin-film transistor, 22 denotes pixel capacitance formed between a pixel electrode (not shown) and an opposed electrode (not shown), with liquid crystal existing between them, 23 denotes the overlap capacitance between the gate and the drain, 24 denotes the overlap capacitance between the gate and the source.

First, the influence of the overlap capacitance 23 will be explained. The signal voltage corresponding to the pixel signal is charged on the pixel capacitance 22 while the thin-film transistor 21 is ON. When a predetermined ON-period has elapsed, the thin-film transistor is turned OFF. In other words, the gate voltage of the thin-film transistor 21 is changed from "1" to "0". If at this time the overlap capacitance 234 did not exist, the voltage of the above-mentioned pixel electrode would remain the same. As it is, the voltage of the above-mentioned pixel electrode becomes lower than the normal value when the above-mentioned gate is turned off by the coupling effect. This leads to deterioration in the black or white level of the image display, i.e., degradation of the contrast ratio, thus affecting the image display quality.

Next, the influence of the overlap capacitance 24 will be explained. It is necessary for the pixel data to charge the above-mentioned pixel electrodes through the signal lines 10 while the above-mentioned gates are ON. When seen from the signal source, however, the overlap capacitance 24 belonging to the thin-film transistors 21 connected to ne signal line 10 is added to, so that, when the capacitance value is large, it is difficult to charge the above-mentioned pixel electrodes up to the predetermined voltage. When, in particular, the number of pixels is augmented and the number of scanning lines 9 increased, the overlap capacitance 24 will increase and the ON period of the above-mentioned gates will decrease, thereby aggravating the above-mentioned undesirable condition. Thus, when the above gates are turned OFF before the above pixel electrodes are sufficiently charged, i.e., before the voltage value of the above pixel electrodes has reached the normal value, the black or white level of the image display is deteriorated, i.e., the contrast ratio is degraded, as in the above case, thus affecting the image display quality.

As described above, the greater the capacitance value of the overlap capacitances 23, 24, the ore the image display quality will be deteriorated.

It is accordingly the object of this invention to provide a method of manufacturing amorphous-silicon thin-film transistors which makes it possible to decrease the overlap capacitance between the gate and the drain and that between the gate and the source, and to obtain a high-quality image with a high contrast ratio.

DESCRIPTION OF THE PREFERRED EMBODIMENTS

An embodiment of this invention will now be described with reference to FIG. 1.

Figure 1A:
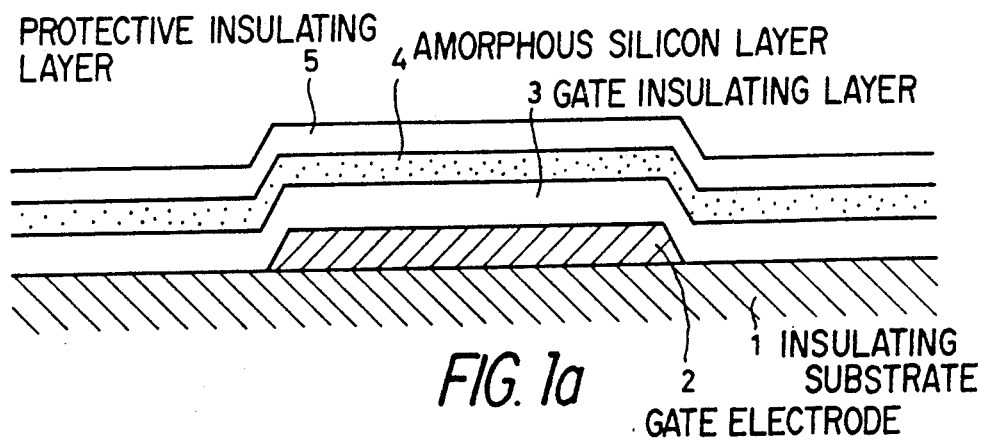
FIGS. 1(a) to 1(d) are a set of sectional views illustrating how an amorphous-silicon thin-film transistor for an active matrix type liquid crystal display is formed in accordance with an embodiment of this invention.
Figure 1B:
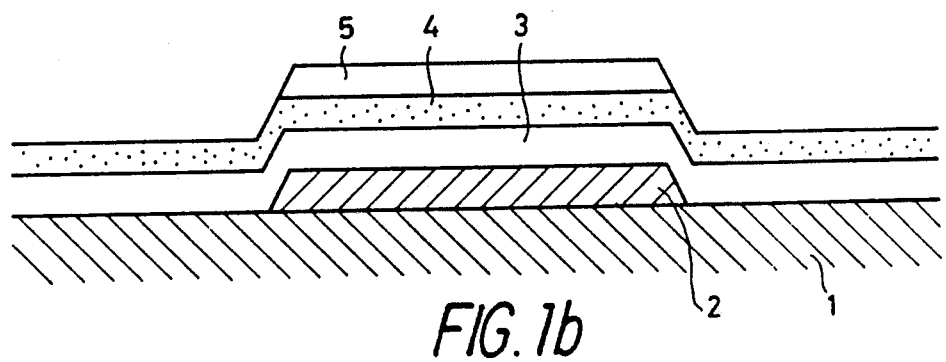
Figure 1C:
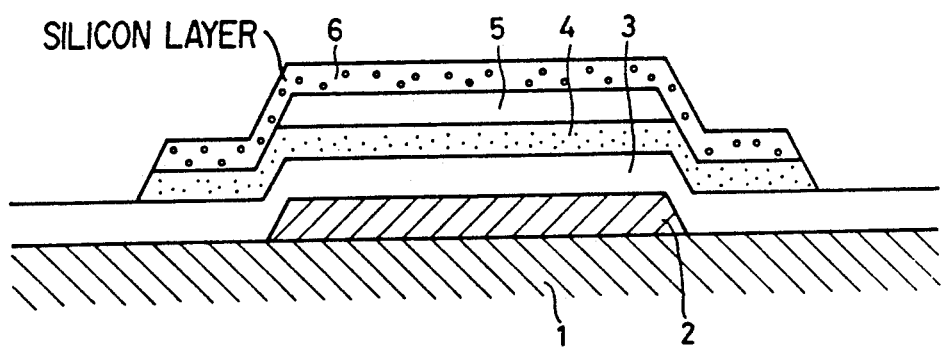
Figure 1D:
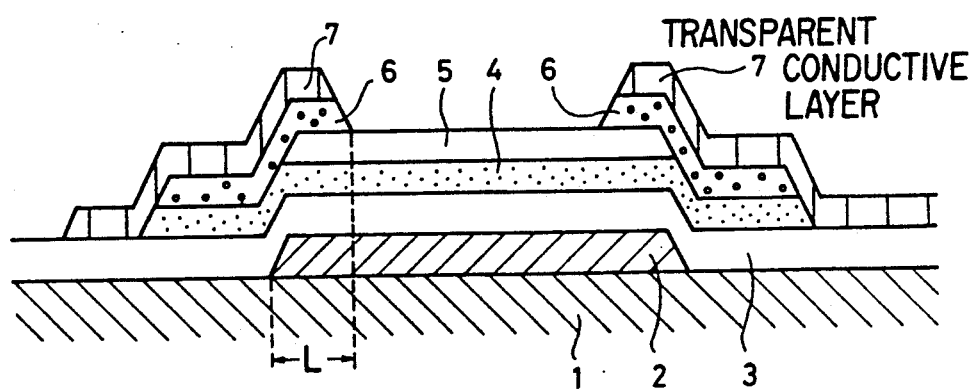

First, a gate electrode 2 of a metal such as Cr is formed on an insulating substrate 1 made of glass or the like. Then, a gate insulating layer 3 of silicon nitride or silicon oxide, an amorphous-silicon layer 4, and a protective insulating layer 5 of silicon nitride or silicon oxide are successively formed by, for example, the plasma CVD method (FIG. 1(a)). Subsequently, a positive-type photoresist (not shown) is applied to the protective insulating layer 5, and after pre-baking, the back surface of the insulating substrate 1 is irradiated with ultraviolet rays. Since the above-mentioned ultraviolet rays are not transmitted through the gate electrode 2, development of the above photoresist results in the photoresist remaining on the gate electrode 2 in a configuration conforming to the gate electrode 2. Etching of the protective insulating layer 5 is conducted using buffer hydrofluoric acid solution, the photoresist thus remaining serving as the mask. This result in a configuration conforming to the gate electrode 2 being imparted to the protective insulating layer 5, as shown in FIG. 1(b). Since the amorphous-silicon layer 4 absorbs the above-mentioned ultraviolet rays applied to the back surface of the insulating substrate 1, the irradiation ratio of the above ultraviolet rays to the above photoresist is decreased. When, however, the film thickness of the amorphous-silicon layer 4 is 30 nanometers or so, several to several tens of percent of the above ultraviolet rays are transmitted, so that an excessive deterioration in the irradiation efficiency of the above ultraviolet rays applied to the above photoresist does not occur. On the contrary, it is advantageous in many ways. For example, it is not necessary to use a mask aliner or the like since the patterning is effected in a conformable manner. Further, a number of substrates can be exposed simultaneously.

Subsequently, a silicon layer 6 containing an appropriate amount of n-type impurities is formed by, for example, the plasma CVD method. This silicon layer 6 and the amorphous-silicon layer 4 are selectively removed to form an island structure (FIG. 1(c)). Next, a transparent conductive layer 7 is formed, and a pattern corresponding to the source electrode, the drain electrode, the source wiring and the pixel electrode is imparted to this transparent conductive layer 7. The silicon layer 6 is then removed using the transparent conductive layer 7 equipped with this pattern as the mask (FIG. 1(d)).

The above-described manufacturing method makes it possible to manufacture an amorphous-silicon transistor which exhibits an overlapping width of L between the gate and the drain and between the gate and the source.

Another embodiment of this invention will now be described with reference to FIG. 2.

Figure 2A:
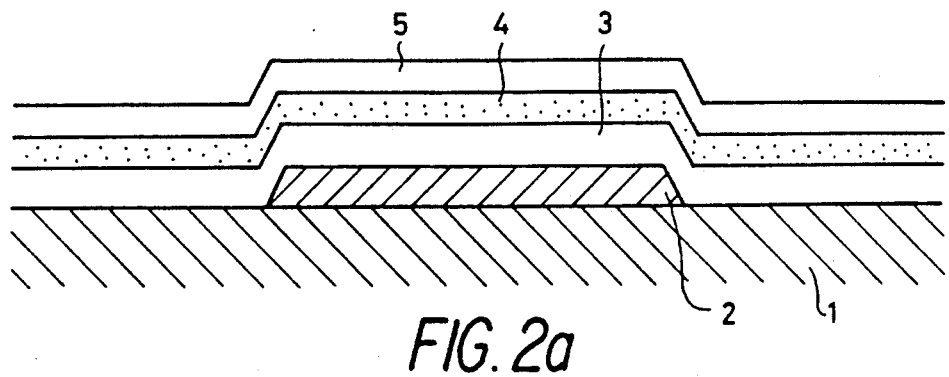
FIGS. 2(a) to 2(d) are a set of sectional views illustrating how an amorphous-silicon thin-film transistor for an active matrix type liquid crystal display is formed in accordance with another embodiment of this invention.
Figure 2B:
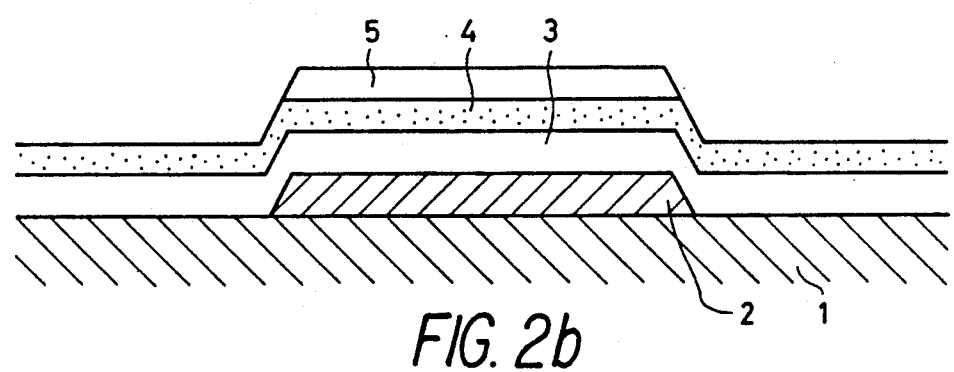
Figure 2C:
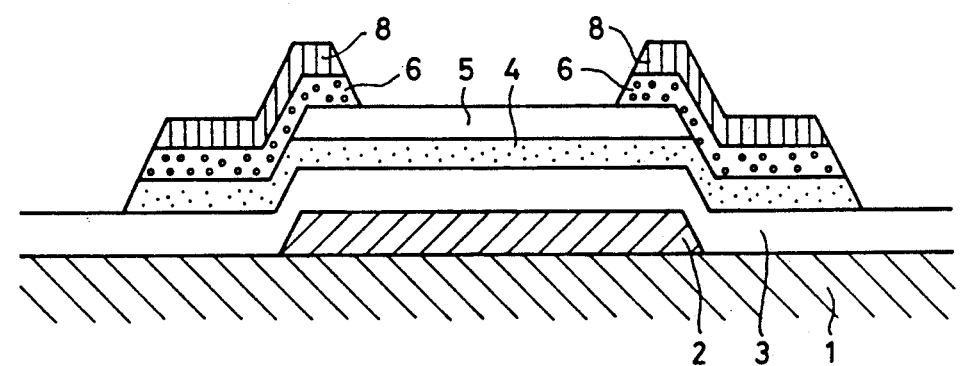
Figure 2D:
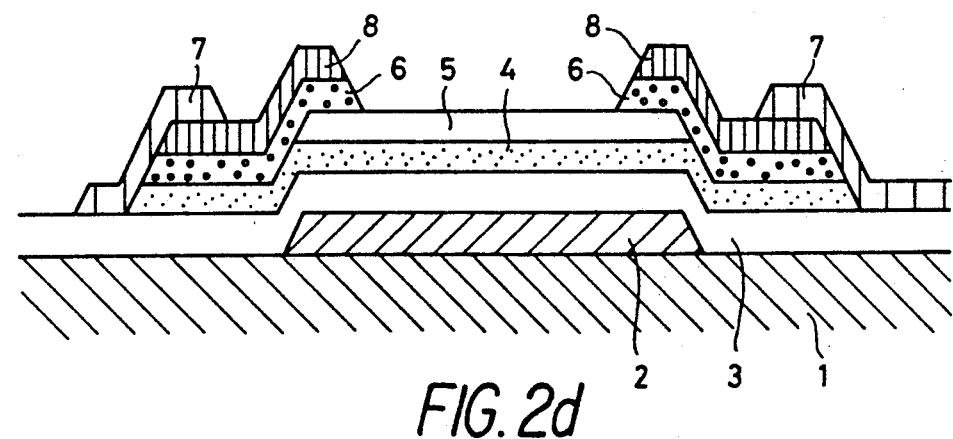
Figure 3:
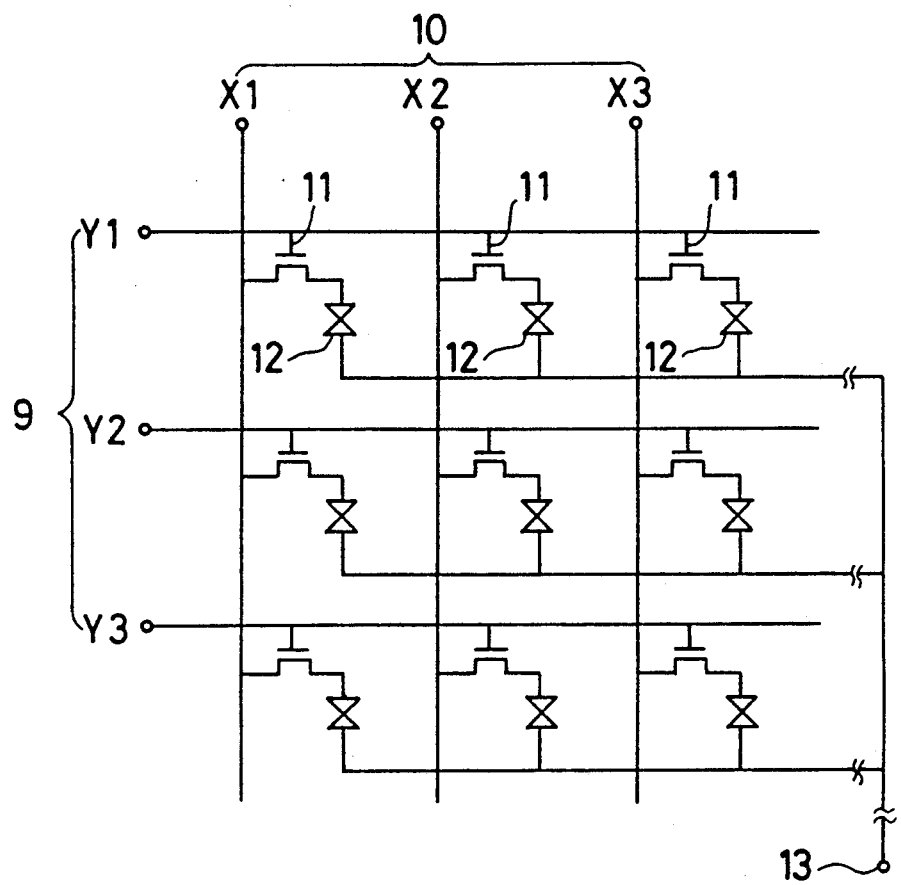
FIG. 3 is an electric circuit diagram showing the construction of an active matrix type liquid crystal display.
Figure 5:
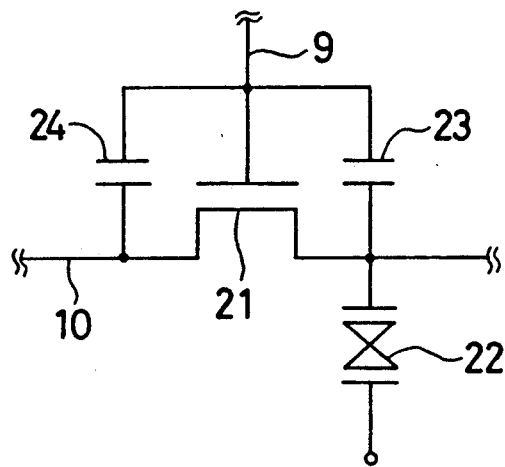
FIG. 5 is an electric circuit diagram showing a pixel of an active matrix type liquid crystal display.
Figure 4A:
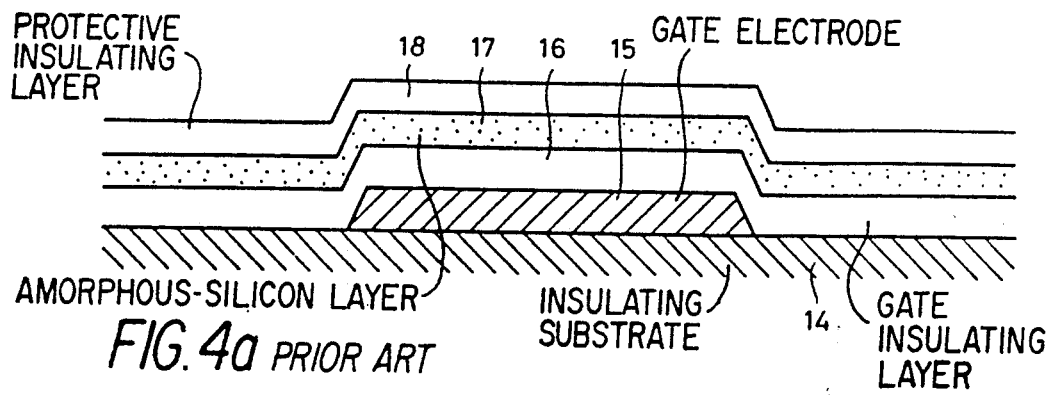
FIGS. 4(a) to 4(d) are a set of sectional views illustrating how an amorphous-silicon thin-film transistor for an active matrix type liquid crystal display is formed in accordance with a conventional method.
Figure 4B:
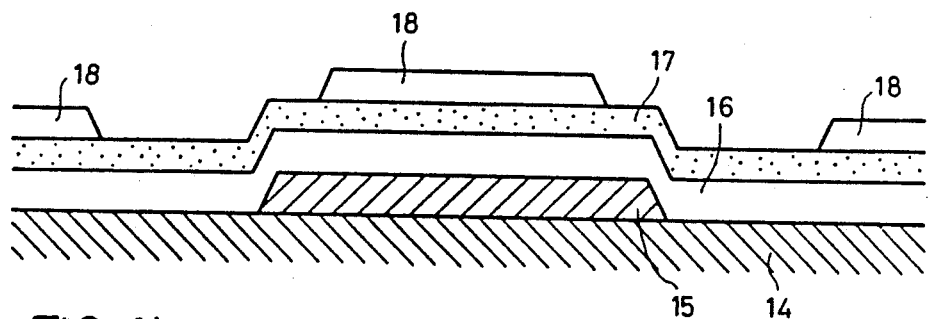
Figure 4C:
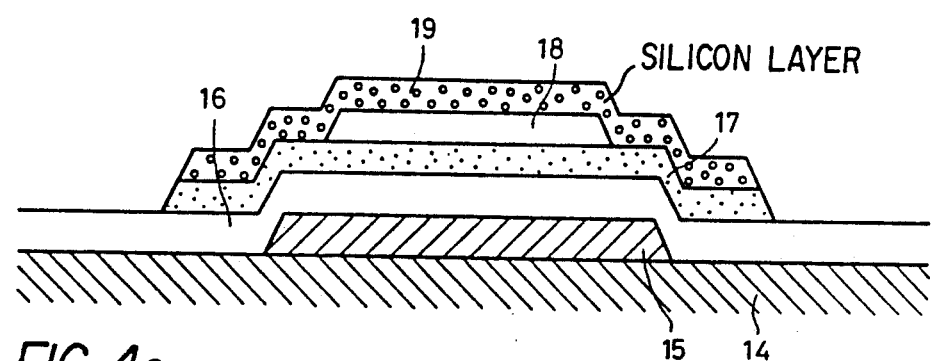
Figure 4D:
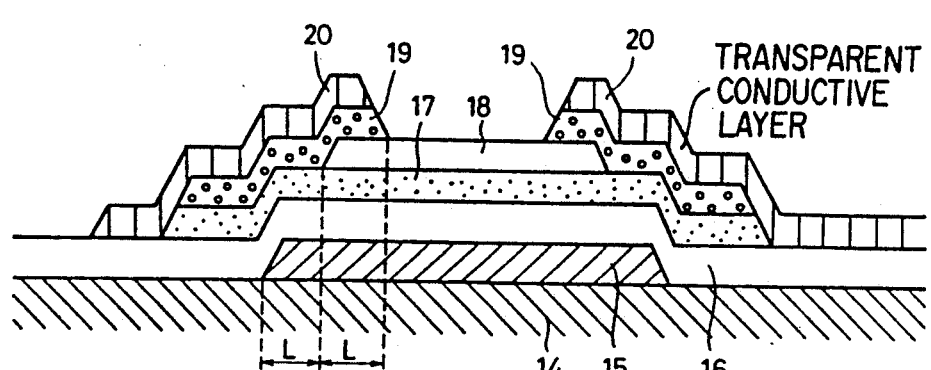

In the drawings, the process of FIGS. 2(a) and (b) are the same as in the first embodiment. After forming a protective insulating layer 5 in a pattern conforming to the gate electrode 2, a silicon layer 6 and a metal layer 8 are successively formed. A pattern corresponding to the source electrode and the drain electrode is imparted to the metal layer 8, and the silicon layer 6 and the amorphous-silicon layer 4 are moved using this metal layer as the mask, thereby forming an island structure (FIG. 2(c)). Subsequently, a transparent conductive layer 7 is formed, and is selectively removed, thereby forming a source wiring connected to the source electrode and a pixel electrode connected to the drain electrode (FIG. 2(d)).

The above-described manufacturing method makes it possible to manufacture an amorphous-silicon transistor which exhibits an overlapping width of L between the gate and the drain and between the gate and the source.

As described above, the overlapping area between the gate and the drain and that between the gate and the source in these embodiments exhibits a minimum width of L. In addition, there exists a protective insulating layer over the entire overlapping areas, so that it is possible to reduce the overlap capacitance by half as compared with the prior art.

Further, by determining the thickness of the gate insulating layer, the amorphous-silicon layer, and the protective insulating layer at 300 nanometers, 50 nanometers, and 300 nanometers, respectively, for example, the overlap capacitance can be reduced to one third of that in the prior art.

ADVANTAGES OF THE INVENTION

In the method of manufacturing amorphous-silicon thin-film transistors in accordance with this invention, the protective insulating layer is formed in such a manner that it conforms to the gate, the width of the overlapping areas existing between the gate and the drain and between the gate and the source can be smaller than in the prior art, the overlap capacitance thereof being reduced by half or less. Consequently, the method makes it possible to manufacture an amorphous-silicon transistor with which a high-quality image with a high contrast ratio can be obtained.

Further, the method in accordance with this invention does not need alignment using a mask when patterning the protective insulating layer, so that inadequacies due to alignment are decreased, which contributes much to improvement in the yield.

We claim:

1. A method of manufacturing amorphous-silicon thin-film transistors, comprising the steps of:
    forming a gate insulating layer on an insulating substrate on which a gate electrode having a predetermined configuration is formed;
    forming an amorphous-silicon layer on said gate insulating layer;

forming a protective insulating layer on said amorphous-silicon layer;

imparting a pattern conforming to said gate electrode to said protective insulating layer while exposing said amorphous-silicon layer at regions outside of said pattern;

coating said protective insulating layer and said amorphous-silicon layer with a silicon layer containing impurities serving as the donor and acceptor;

forming a source electrode and a drain electrode in such a manner that they partly overlap said protective insulating layer; and then simultaneously removing said impurity containing silicon layer and said amorphous-silicon layer using said source electrode and drain electrode as a mask, to form an island structure.

2. A method of manufacturing amorphous-silicon thin-film transistors as claimed in claim 1 comprising the steps of radiating the back surface of said insulating substrate with light so as to expose photoresist applied to said protective insulating layer and removing said protective insulating layer using a photoresist pattern which is obtained by developing said photoresist as the mask, thereby imparting to said protective insulating layer a pattern conforming to said gate electrode.

3. A method of manufacturing amorphous-silicon thin-film transistors as claimed in claim 1 comprising the step of forming said source electrode and drain electrode from a metal layer.

* * * * *